(12) United States Patent
Insanic et al.

(10) Patent No.: US 10,217,920 B2
(45) Date of Patent: Feb. 26, 2019

(54) BURIED SENSOR SYSTEM

(71) Applicant: RAYTHEON BBN TECHNOLOGIES CORP., Cambridge, MA (US)

(72) Inventors: Edin Insanic, Belmont, MA (US); Joshua Cochin, Cambridge, MA (US); Alex Benjamin Jordan, Chelmsford, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 196 days.

(21) Appl. No.: 15/203,710

(22) Filed: Jul. 6, 2016

(65) Prior Publication Data
US 2018/0013048 A1   Jan. 11, 2018

(51) Int. Cl.
*H01L 35/10* (2006.01)
*H01L 35/16* (2006.01)
(Continued)

(52) U.S. Cl.
CPC ............... *H01L 35/10* (2013.01); *F24J 3/08* (2013.01); *H01L 35/16* (2013.01); *H01L 35/30* (2013.01); *H01L 35/32* (2013.01)

(58) Field of Classification Search
None
See application file for complete search history.

(56) References Cited

U.S. PATENT DOCUMENTS 3,232,719 A * 2/1966 Ritchie .................. H01L 35/08
                                                                    136/201
3,412,566 A * 11/1968 Townsend ............... F25B 21/02
                                                                    136/212
(Continued)

FOREIGN PATENT DOCUMENTS

| GB | 2 336 943 A | 11/1999 |
|---|---|---|
| WO | WO 2012/078024 A1 | 6/2012 |
| WO | WO 2013/107637 A2 | 7/2013 |

OTHER PUBLICATIONS

Lawrence, E.E. et al., A Study of Heat Sink Performance in Air and Soil for Use in a Thermoelectric Energy Harvesting Device, 2002, 4 Pages, Reed College, Portland, OR, Jet Propulsion Laboratory/California Institute of Technology, Pasadena, CA, U.S.
(Continued)

*Primary Examiner* — Eric R Smith
(74) *Attorney, Agent, or Firm* — Lewis Roca Rothgerber Christie LLP

(57) ABSTRACT

A sensing system including in-ground sensors not requiring battery power. A thermoelectric generator sensor rod includes an upper thermal contact and a lower thermal contact at or near its two ends. When the thermoelectric generator sensor rod is buried in the ground with one end buried more deeply than the other, a temperature gradient in the soil produces a temperature difference between the upper thermal contact and the lower thermal contact. The upper thermal contact and the lower thermal contact are thermally connected to a thermoelectric generator, e.g., by heat pipes or thermally conductive rods. Electrical power generated by the thermoelectric generator powers sensors for monitoring conditions in the ground, and circuitry for transmitting sensor data to a central data processing system.

20 Claims, 9 Drawing Sheets

(51) Int. Cl.
*H01L 35/30* (2006.01)
*H01L 35/32* (2006.01)
*F24J 3/08* (2006.01)

(56) References Cited

U.S. PATENT DOCUMENTS

| | | | | |
|---|---|---|---|---|
| 3,808,889 | A | * | 5/1974 | Rawson ............... E21B 47/065 |
| | | | | 374/134 |
| 4,047,093 | A | | 9/1977 | Levoy |
| 4,546,268 | A | * | 10/1985 | Caldwell ................ H03K 5/07 |
| | | | | 307/106 |
| 2006/0001525 | A1 | * | 1/2006 | Nitzan ............... G06K 19/0702 |
| | | | | 340/10.1 |
| 2007/0032547 | A1 | * | 2/2007 | Friedman ................ A61F 7/007 |
| | | | | 514/534 |
| 2007/0125413 | A1 | * | 6/2007 | Olsen ..................... H01L 35/08 |
| | | | | 136/205 |
| 2013/0005372 | A1 | | 1/2013 | Strei et al. |
| 2013/0061899 | A1 | * | 3/2013 | Tosi ....................... G21H 1/103 |
| | | | | 136/202 |

OTHER PUBLICATIONS

Silva, Agnelo R. et al., Empirical Evaluation of Wireless Underground-to-Underground Communication in Wireless Underground Sensor Networks, 2009, pp. 231-244, Springer-Verlag Berlin Heidelberg.

Stevens, James W., Performance factors for ground-air thermoelectric power generators, Energy Conversion and Management, 2013, pp. 114-123, vol. 68, Elsevier Ltd.

Wang, Jennifer et al., A New Vision for Smart Objects and the Internet of Things: Mobile Robots and Long-Range UHF RFID Sensor Tags, sited as "arXiv:1507.02373 [cs.RO]", Jul. 9, 2015, 8 pages.

Whalen, Scott A. et al., Thermoelectric energy harvesting from diurnal heat flow in the upper soil layer, Energy Conversion and Management, 2012, pp. 397-402, vol. 64, Elsevier Ltd.

International Search Report from corresponding International Application No. PCT/US2017/040758, International Search Report dated Aug. 31, 2017 and dated Sep. 12, 2017 (5 pgs.).

Written Opinion of the International Searching Authority from corresponding International Application No. PCT/US207/040758, dated Sep. 12, 2017 (5 pgs.).

\* cited by examiner

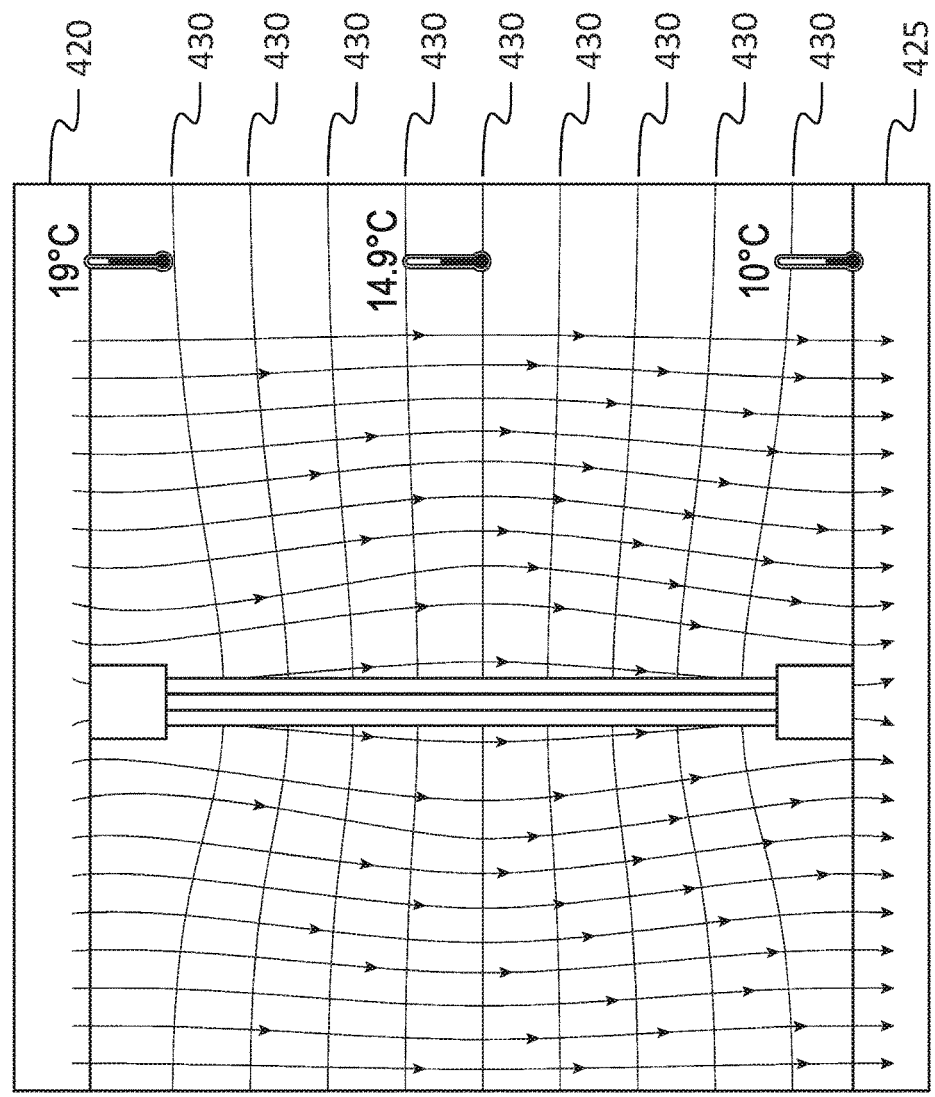

BURIED SENSOR SYSTEM

BACKGROUND

1. Field

One or more aspects of embodiments according to the present invention relate to in-ground sensing systems, and more particularly to an in-ground sensing system not requiring battery power.

2. Description of Related Art

Numerous commercial and military applications exist for sensors that monitor various quantities from within the ground. Examples include sensors monitoring soil conditions (e.g., moisture, temperature, pH, or the abundance of certain chemicals) or sound or vibration sensors e.g., for detecting the passage of vehicles. Such sensors may use electrical power. Providing power to a network of buried sensor via buried wires may be costly. Some related art sensors may be battery powered; battery powered sensors, however, may have the disadvantage that replacing or recharging batteries may be burdensome or costly.

Thus, there is a need for an in-ground sensor system that does not require batteries for power.

SUMMARY

Aspects of embodiments of the present disclosure are directed toward a sensing system including in-ground sensors not requiring battery power. A thermoelectric generator sensor rod includes an upper thermal contact and a lower thermal contact at or near its two ends. When the thermoelectric generator sensor rod is buried in the ground with one end buried more deeply than the other, a temperature gradient in the soil produces a temperature difference between the upper thermal contact and the lower thermal contact. The upper thermal contact and the lower thermal contact are thermally connected to a thermoelectric generator, e.g., by heat pipes or thermally conductive rods. Electrical power generated by the thermoelectric generator powers sensors for monitoring conditions in the ground, and circuitry for transmitting sensor data to a central data processing system.

According to an embodiment of the present invention there is provided a system for underground sensing, the system including a thermoelectric generator sensor rod, including: a sensor; a first thermal contact surface for making contact with soil; a second thermal contact surface for making contact with soil; a thermoelectric generator having: a first heat exchange surface; a second heat exchange surface; a first electrical contact; and a second electrical contact; a first thermally conductive member connecting the first thermal contact to the first heat exchange surface; a second thermally conductive member connecting the second thermal contact to the second heat exchange surface; and a processing unit, the thermoelectric generator being configured to provide electrical power at the first electrical contact and the second electrical contact in response to a difference between a temperature at the first heat exchange surface and the second heat exchange surface, and the processing unit being configured to receive electrical power produced by the thermoelectric generator and to receive a reading from the sensor, and to store the reading.

In one embodiment, the sensor rod has a diameter greater than 0.5 inches and less than 5 inches, and a length greater than 48 inches and less than 120 inches.

In one embodiment, the first thermally conductive member is a metal rod.

In one embodiment, the first thermally conductive member is a heat pipe.

In one embodiment, the system includes an insulating sleeve enclosing the first thermally conductive member, the second thermally conductive member, and the thermoelectric generator.

In one embodiment, the sensor is selected from the group consisting of temperature sensors, humidity sensors, acoustic sensors, seismic sensors, accelerometers, pH sensors, and chemical sensors.

In one embodiment, the sensor is a chemical sensor selected from the group consisting of nitrogen sensors, potassium sensors, phosphorous sensors, pesticide sensors, and herbicide sensors.

In one embodiment, the system includes a communicator configured to be controlled by the processing unit to transmit sensor data as acoustic signals.

In one embodiment, the system includes a communicator configured to be controlled by the processing unit to transmit sensor data as electromagnetic signals.

In one embodiment, the electromagnetic signals are radio frequency signals.

In one embodiment, the system includes an unmanned aerial vehicle configured to receive the radio frequency signals.

In one embodiment, the system includes a communicator configured to have a radar cross section modulated according to bits of sensor data in binary form.

In one embodiment, the communicator includes: a first elongated conductor; and a second elongated conductor, arranged end to end, and connected with a switching element.

In one embodiment, the switching element is a microwave transistor.

In one embodiment, the processing unit is configured to operate in either a waking mode or a sleep mode, the processing unit being configured to consume less power when operating in the sleep mode than when operating in the waking mode.

In one embodiment, the processing unit consumes less than 0.5 W when operating in the sleep mode.

In one embodiment, the thermoelectric generator sensor rod further includes a capacitor, and the thermoelectric generator sensor rod is configured to charge the capacitor utilizing electric power generated by the thermoelectric generator.

In one embodiment, the system includes a switched mode power supply connected to the thermoelectric generator and to the capacitor and configured to charge the capacitor utilizing electric power generated by the thermoelectric generator.

In one embodiment, the thermoelectric generator includes beryllium telluride or graphene.

In one embodiment, the system is installed underground, with the first thermal contact surface in contact with soil at a first depth, and the second thermal contact surface in contact with soil at a second depth, the second depth differing from the first depth by at least 48 inches.

BRIEF DESCRIPTION OF THE DRAWINGS

Features, aspects, and embodiments are described in conjunction with the attached drawings, in which:

FIG. 4B is an illustration of thermal analysis results, according to an embodiment of the present invention;

DETAILED DESCRIPTION

The detailed description set forth below in connection with the appended drawings is intended as a description of exemplary embodiments of a buried sensor system provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
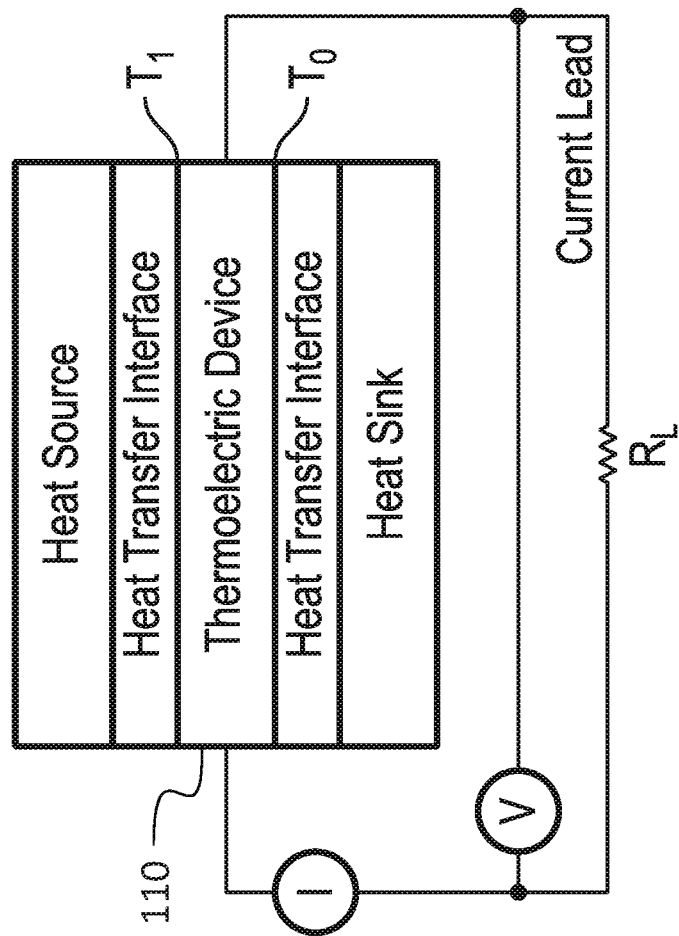
FIG. 1 is a schematic diagram of a thermoelectric generator, according to an embodiment of the present invention.

Referring to FIG. 1, in one embodiment, a sensor system includes a power source that generates electrical power using a temperature difference between a heat source at a first temperature and a heat sink at a lower temperature. Each of the heat source and the heat sink may be connected to, and brought into thermal contact with, a respective surface of a thermoelectric device, or "thermoelectric generator" (TEG) 110, by a respective heat transfer interface. The heat transfer interface may be a thermally-conductive compliant material (e.g., an elastomer, a gel, or a grease) that conforms to two surfaces between which it is disposed, to form a thermal connection between the two surface.

The thermoelectric generator 110 may be any of a variety of devices that develops an electric potential difference, e.g., as a result of the Seebeck effect, across two terminals in response to a temperature difference between two surfaces of the thermoelectric generator 110. The thermoelectric generator 110 may, for example, include n-doped and p-doped semiconductors connected between the terminals of the thermoelectric generator 110. In some embodiments the thermoelectric generator 110 includes graphene, or n-doped and/or p-doped beryllium telluride. The thermoelectric generator 110 may in turn include a plurality of stacked thermoelectric generators (or "thermoelectric modules") 110.

Figure 2A:
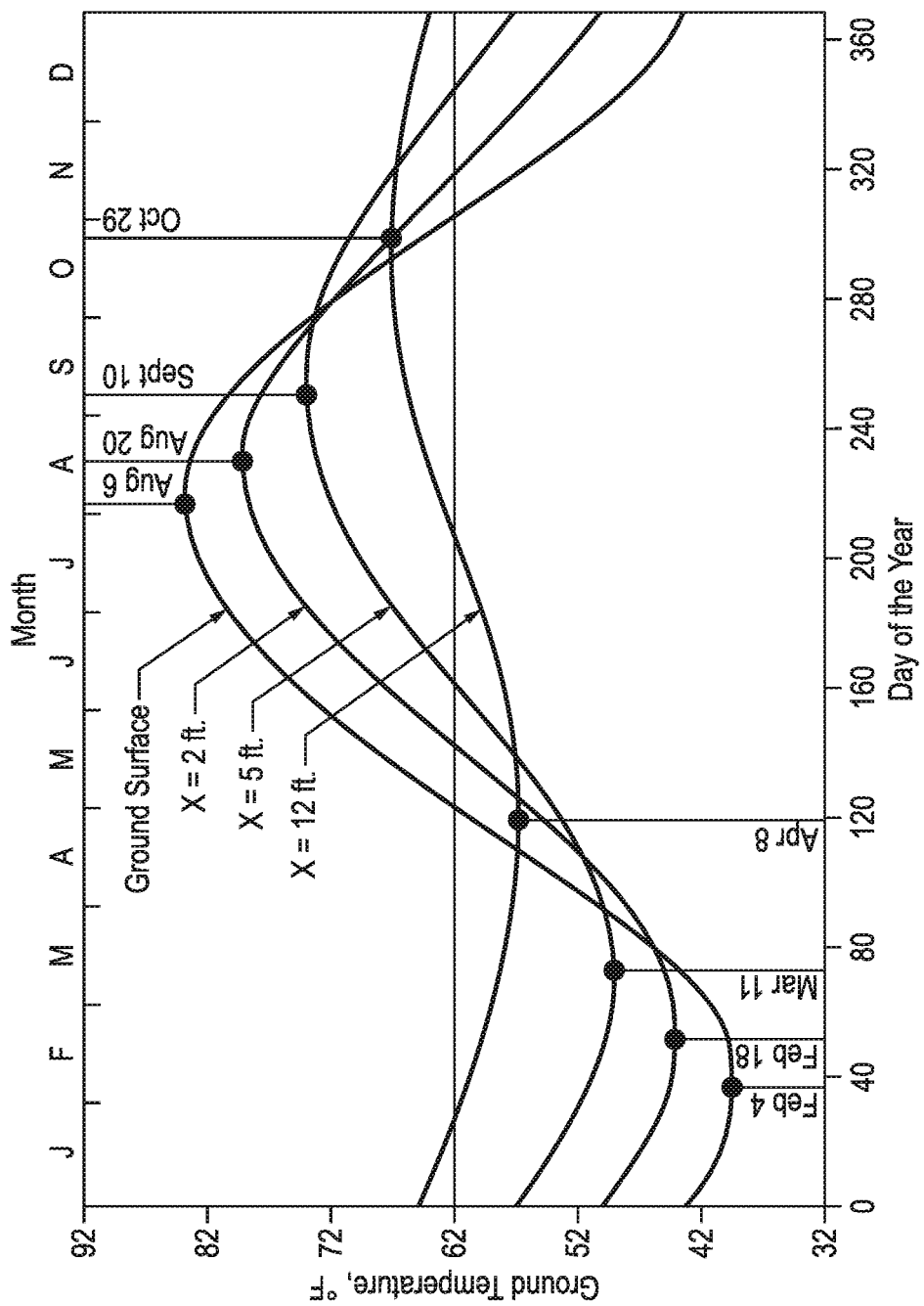
FIG. 2A is a graph of subterranean and surface temperatures, according to an embodiment of the present invention.
Figure 2B:
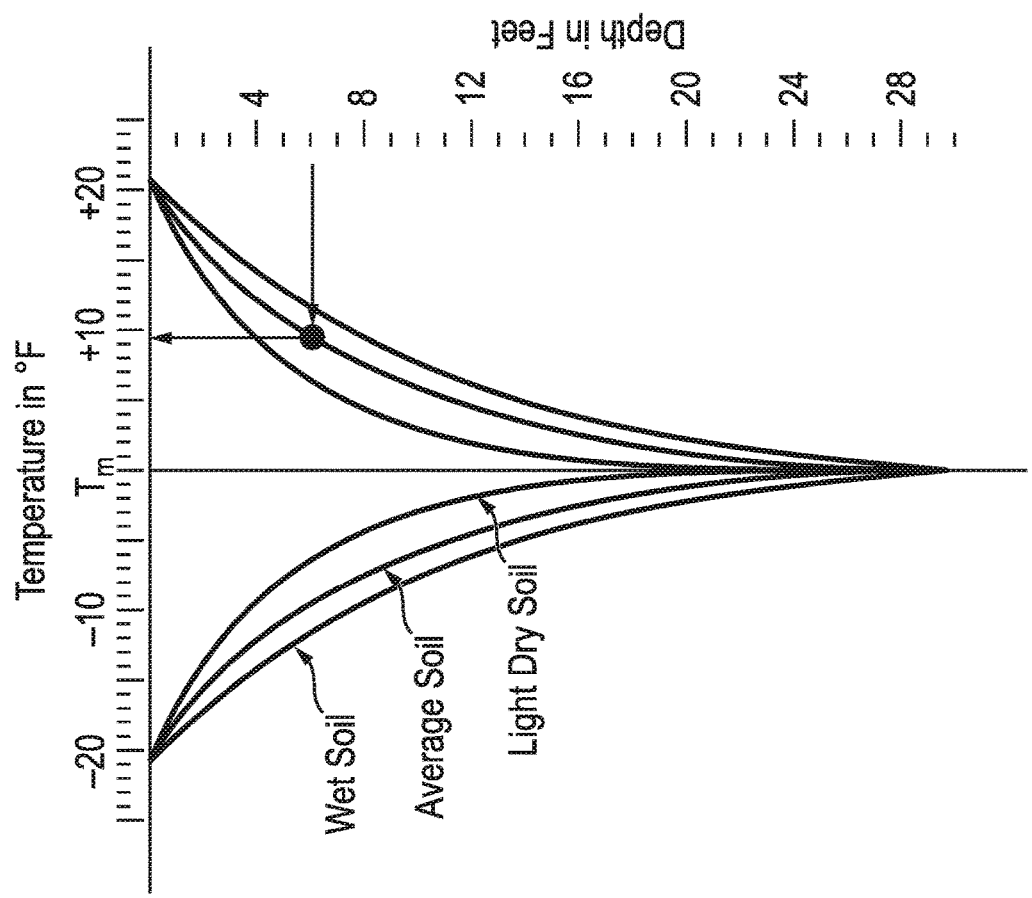
FIG. 2B is a graph of subterranean and surface temperature ranges, according to an embodiment of the present invention.

Referring to FIGS. 2A and 2B, in some embodiments, surface soil temperatures and subterranean temperatures may vary with time and with depth. For example, referring to FIG. 2A, at depths of 12 feet or more, the temperature may vary, over a year, by only about 10 degrees Fahrenheit, whereas at a depth of 2 feet the soil temperature may be, on average, about 45 degrees Fahrenheit warmer during the summer than during the winter. There may also be a corresponding vertical temperature gradient, so that, for example, in the summer, the soil may be about 20 degrees Fahrenheit warmer at the surface than at a depth of 12 feet, and in the winter, the soil may be about 20 degrees Fahrenheit cooler at the surface than at a depth of 12 feet. FIG. 2B shows the seasonal variation of soil temperature, above and below a mean soil temperature $T_m$, at various depths and for various moisture content levels.

The data of FIGS. 2A and 2B are time-averaged so as not to show diurnal temperature variations, which may cause additional variations with time (on short time scales) and with depth. For example, during the day, the sun may heat the surface soil, resulting in a subterranean temperature profile with a temperature that decreases with increasing depth below the surface. At night, the surface soil may cool significantly as a result of conduction to the atmosphere and radiation, resulting in a subterranean temperature profile with a temperature that increases with increasing depth below the surface. Such variations may, however, be unimportant except at relatively shallow depths.

Figure 3A:
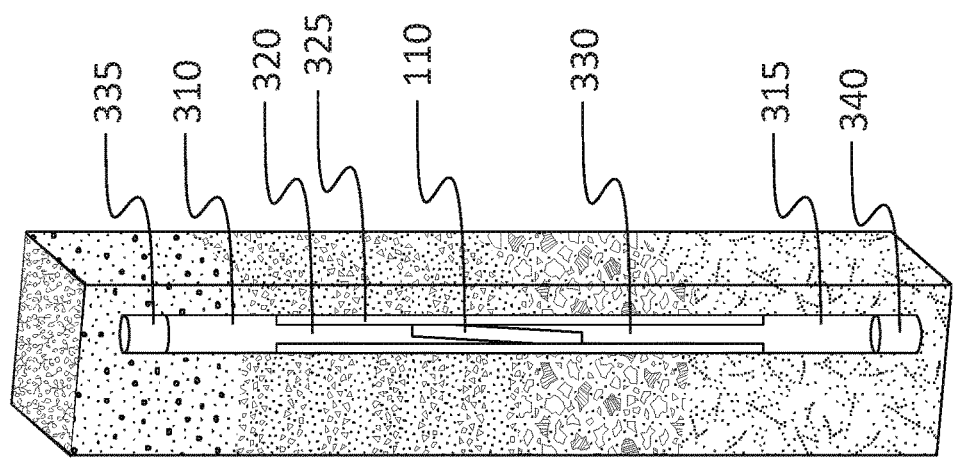
FIG. 3A is a cut-away view of a buried thermoelectric generator sensor rod, according to an embodiment of the present invention.

Subterranean temperature gradients may be exploited to provide electrical energy to a sensor system. Referring to FIG. 3A, in one embodiment a thermoelectric generator sensor rod includes an upper thermal contact 310, and a lower thermal contact 315, each of which includes a respective contact surface for forming a thermal contact with the soil, at a first temperature, surrounding an upper portion and the soil, at a second temperature, a lower portion of the thermoelectric generator sensor rod. When the second temperature differs from the first temperature, the thermoelectric generator sensor rod may use the temperature difference to generate electrical power. The upper thermal contact 310 may be in thermal contact with (e.g., one contiguous piece with) one end of a first thermally conductive member 320, the other end of which may be in thermal contact with a first surface of a thermoelectric generator 110. The second surface of the thermoelectric generator 110 may be in thermal contact with one end of a second thermally conductive member 330, the other end of which is in thermal contact with the lower thermal contact 315. An insulating sleeve 325 (e.g., an expanded polyethylene tube) may enclose the first thermally conductive member 320, the thermoelectric generator 110, and the second thermally conductive member 330. An upper housing 335 may enclose and protect a communicator and a sensor. In some embodiments the thermoelectric generator sensor rod may extend to the ground surface or slightly above the surface, and accordingly may be capable of harvesting energy from diurnal temperature variations occurring near the surface or in the air above the surface. In some such embodiments the upper end of the thermoelectric generator sensor rod may be concealed under, for example a cover artificially fabricated to resemble a rock.

Figure 3B:
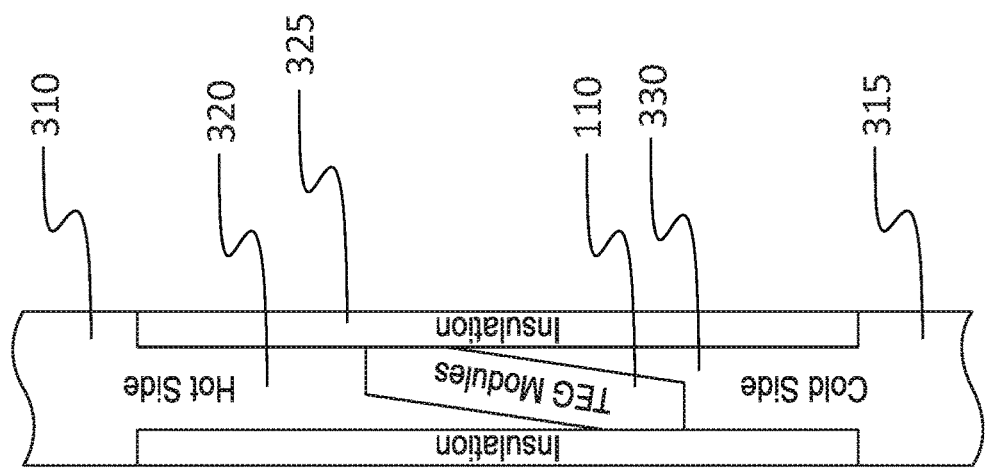
FIG. 3B is a cross-sectional view of a portion of a thermoelectric generator sensor rod, according to an embodiment of the present invention.

Referring to FIG. 3B, in one embodiment, if the first temperature is higher than the second temperature, heat may flow from the hot side to the cold side, i.e., from the soil at a first depth into the upper thermal contact 310, through the first thermally conductive member 320, through the thermoelectric generator 110, through the second thermally conductive member 330, and through the lower thermal contact 315 into the soil at a second depth. In some embodiments, the thermoelectric generator 110 may be installed in the thermoelectric generator sensor rod at an angle (as illustrated in FIGS. 3A and 3B) so that the area of the contact surfaces at which the thermoelectric generator 110 is in contact with the first thermally conductive member 320 and the second thermally conductive member 330 may be greater than the cross-sectional area of the first thermally conductive member 320 and the second thermally conductive member 330.

Figure 4A:
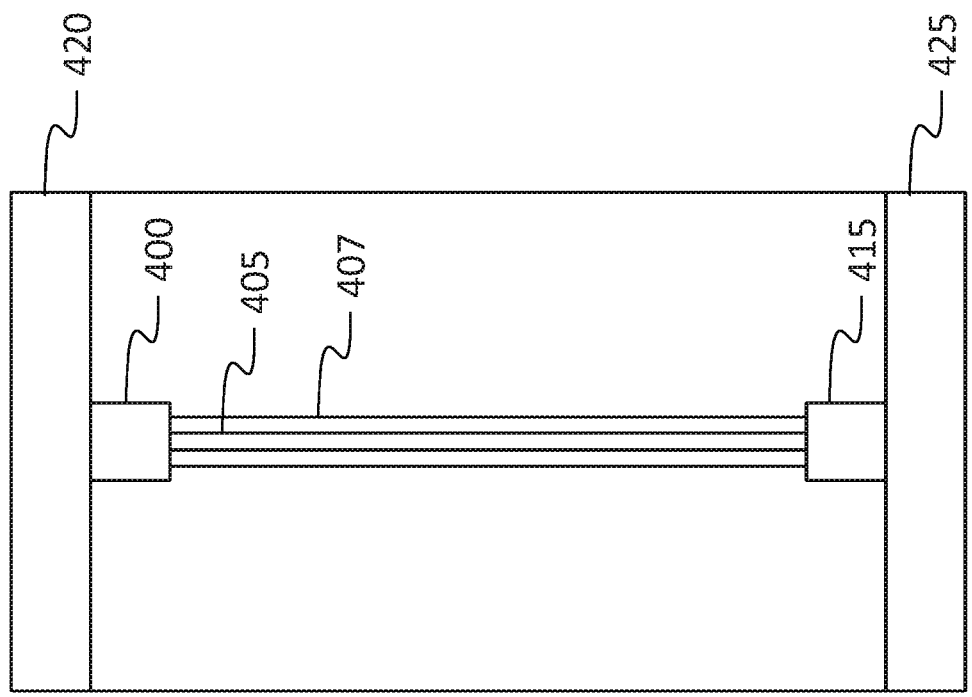
FIG. 4A schematic view of a model for thermal analysis, according to an embodiment of the present invention.

Referring to FIGS. 4A and 4B, in one embodiment, a numerical model may be employed to analyze the heat flow through a thermoelectric generator sensor rod and to estimate the electrical power available if the heat flows through a thermoelectric generator in the thermoelectric generator sensor rod. For example, referring to FIG. 4A, the thermoelectric generator sensor rod may be modeled as consisting of an upper aluminum heat sink 400 with a radius of 4 inches and a length of 10 inches, an aluminum rod 405 with a diameter of 1 inch and a length of 6 feet, wrapped in an insulating foam sleeve 407 with a wall thickness of 1 inch, and a lower aluminum heat sink 415 with a radius of 4 inches and a length of 10 inches. The upper surface of the upper aluminum heat sink 400 may be modeled as being in thermal contact with a heat source 420 at 20° C. and the lower surface of the lower aluminum heat sink 415 may be modeled as being in thermal contact with a heat source 425 at 10° C.

Referring to FIG. 4B, a finite element analysis of the model of FIG. 4A may reveal that in steady state 0.4 W of heat may flow through the aluminum rod 405, and that the presence in the soil of the thermoelectric generator sensor rod may alter the isotherms 430, which in the absence of the thermoelectric generator sensor rod would be straight and horizontal. A modified model, in which a heat pipe is substituted for the aluminum rod 405, may show a heat flow about 6 times greater. Assuming a 0.1% conversion efficiency in the thermoelectric generator 110 (i.e., the ratio of electrical power generated by the thermoelectric generator 110 to the heat energy flowing through the thermoelectric generator 110), the above-described model may be interpreted to imply that 0.5 mW of electrical power may be available in an embodiment including the aluminum rod 405, and that 3 mW of electrical power may be available in an embodiment including a heat pipe instead.

In some embodiments the thermoelectric generator 110 may generate power at an average rate of 0.5 mW, and circuitry in the thermoelectric generator sensor rod may consume power at a higher peak rate, and at a duty cycle of less than 100%. For example, the circuitry may operate most of the time in a low-power, or "sleep" mode, waking up only occasionally to perform sensing operations (e.g., to sense soil moisture) and (at the same rate or at a lower rate) to communicate the sensing results to, for example, a central data processing system.

For example, a farm may be equipped with a large array of thermoelectric generator sensor rods, all buried below plow depth (e.g., with the top of each thermoelectric generator sensor rod being at a depth of 8 inches or more). Each thermoelectric generator sensor rod may perform periodic soil moisture measurements and communicate the results to a central data processing system, which may be used by a farmer to make irrigation decisions, or which may be used directly by an automatic irrigation controller. Each thermoelectric generator sensor rod may sleep most of the time, waking up, for example, only once per day or once every few hours to conduct a moisture sensing operation and transmit the resulting data back to the central data processing system.

When the thermoelectric generator sensor rod is operating in sleep mode, the thermoelectric generator 110 may charge a capacitor, which may store enough energy for sensing and/or communication operations when the circuitry of the thermoelectric generator sensor rod wakes up. The capacitor may be connected directly across the electrical terminals of the thermoelectric generator 110. In such an embodiment, the voltage across the thermoelectric generator 110 may initially be low, and may increase as the capacitor is charged. This may result in lower power output from the thermoelectric generator 110 when the capacitor is in a low state of charge, and when the capacitor is charged to the maximum output voltage of the thermoelectric generator 110.

In one embodiment, a switched-mode power supply converts the voltage and current generated by the thermoelectric generator 110 to the voltage on the capacitor. The output voltage of the thermoelectric generator 110 may depend on the current drawn from it; accordingly, for any given temperature difference across the thermoelectric generator 110, there may be an operating voltage at which the electrical power delivered is greatest. Accordingly, in some embodiments, the switched-mode power supply adjusts (e.g., using a closed-loop control system) the current drawn from the thermoelectric generator 110 so as to operate the thermoelectric generator 110 near an operating point at which it may deliver the maximum power.

The thermoelectric generator sensor rod may include one or more of each of various types of sensors, e.g., soil humidity sensors, temperature sensors, acoustic sensors, seismic sensors, soil acidity sensors (e.g., pH sensors), or chemical sensors, e.g., sensors measuring concentrations of nitrogen, phosphorous, potassium, pesticides, or herbicides. Acoustic sensors may be used, for example, to detect passing vehicles. Each sensor may have a digital output or an analog output. The thermoelectric generator sensor rod may include one or more analog to digital converters for converting analog sensor signals to digital signals. The thermoelectric generator sensor rod may include a processing unit for controlling the operation of the thermoelectric generator sensor rod. The processing unit may, for example, read the sensors, store sensor data, control transition to sleep mode, control transition to waking mode, and arrange for transmission of stored sensor data to a central data processing system.

In some embodiments, the installation of a thermoelectric generator sensor rod may proceed as follows, for a thermoelectric generator sensor rod with, for example, a two inch diameter. First a hole, e.g., a hole three inches in diameter, may be bored substantially vertically into the ground, to a depth that is at least the length of the thermoelectric generator sensor rod plus the depth at which the top of the thermoelectric generator sensor rod is to be buried. Next, the thermoelectric generator sensor rod may be lowered into the hole.

Figure 5:
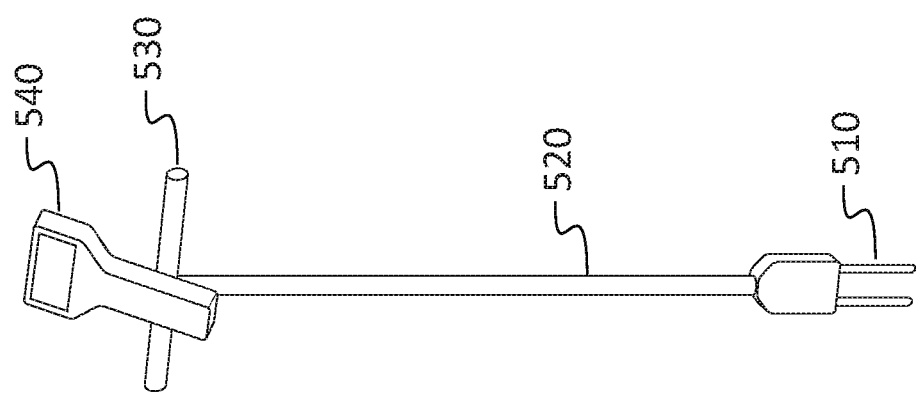
FIG. 5 is a perspective view of an insertion pole, according to an embodiment of the present invention.

After the thermoelectric generator sensor rod has been lowered to the point at which only a short section of it remains above ground (e.g., for an operator or installer to grasp), it may be further lowered with the help of an insertion pole, illustrated for example in FIG. 5. The insertion pole may include two prongs 510 for forming a mechanical and electrical connection with the thermoelectric generator sensor rod, a shaft 520, two handles 530, and an operator console 540. The operator installing the thermoelectric generator sensor rod may secure the insertion pole to the thermoelectric generator sensor rod after the latter has been lowered part-way into the hole, or before beginning to lower the thermoelectric generator sensor rod into the hole, e.g., by assembling the thermoelectric generator sensor rod and the insertion pole while both are lying on the ground, near the hole.

The operator may then grasp the handles 530 of the insertion pole and lower the thermoelectric generator sensor rod to the desired depth. The gap between the thermoelectric generator sensor rod may then be filled, e.g., with a suitable cement or with a suitable slurry. The operator console 540 may include keys and a display to allow the operator to interact with the operator console 540, and, through the operator console 540, with the thermoelectric generator sensor rod. The operator console 540 may be used to verify the operation of the thermoelectric generator sensor rod, e.g., to verify that its circuitry is operating correctly, that its sensors are generating plausible data, and that the subterranean temperature gradient is sufficient for adequate power generation. After installation and in-ground verification is complete, the thermoelectric generator sensor rod may be released, by a suitable release mechanism, from the two prongs 510 of the insertion pole, and the remaining hole may be filled, e.g., with dirt or a material that improves thermal conductivity.

In some embodiments the thermoelectric generator sensor rod may include, at its lower end, a drill tip 340 (FIG. 3A) so that the thermoelectric generator sensor rod may double as a boring tool for forming a hole in which the thermoelectric generator sensor rod is installed. In such an embodiment, the thermoelectric generator sensor rod may have, near its upper end, a mechanical configuration allowing it to be coupled to an auger attachment, or "post hole digger" attachment, for a tractor. For example, the upper end of the thermoelectric generator sensor rod may have a hollow portion with an inner diameter of about 2 inches or about 2 9/16 inches (e.g., sized to fit on the spindle of the auger attachment to be used), and with a transverse hole. The thermoelectric generator sensor rod may then be secured to the auger attachment in the same manner as an auger, e.g., by inserting the upper end of the spindle of the auger attachment into the hollow upper end of the thermoelectric generator sensor rod, and securing the thermoelectric generator sensor rod to the spindle with a transverse bolt or clevis pin passing through the transverse hole in the upper end of the thermoelectric generator sensor rod and through a corresponding transverse hole in the spindle. The auger attachment may then be used to cause the thermoelectric generator sensor rod to turn, so that the drill tip bores a hole for the thermoelectric generator sensor rod as it is lowered.

The thermoelectric generator sensor rod may include a communications system or "communicator" to communicate sensor data obtained by the thermoelectric generator sensor rod, e.g., back to a central data processing system. In some embodiments, data are transmitted acoustically, from the thermoelectric generator sensor rod to a receiving station (that may also be used by other thermoelectric generator sensor rods). The transmission may be direct or relayed, e.g., by other thermoelectric generator sensor rods. In some embodiments sensor data are transmitted as modulated electromagnetic radiation, e.g., radio frequency or microwave signals generated by the thermoelectric generator sensor rod. These signals may be transmitted, for example, to a tower near the thermoelectric generator sensor rod (and possibly also near other thermoelectric generator sensor rods), upon which a corresponding receiver is mounted.

Figure 6:
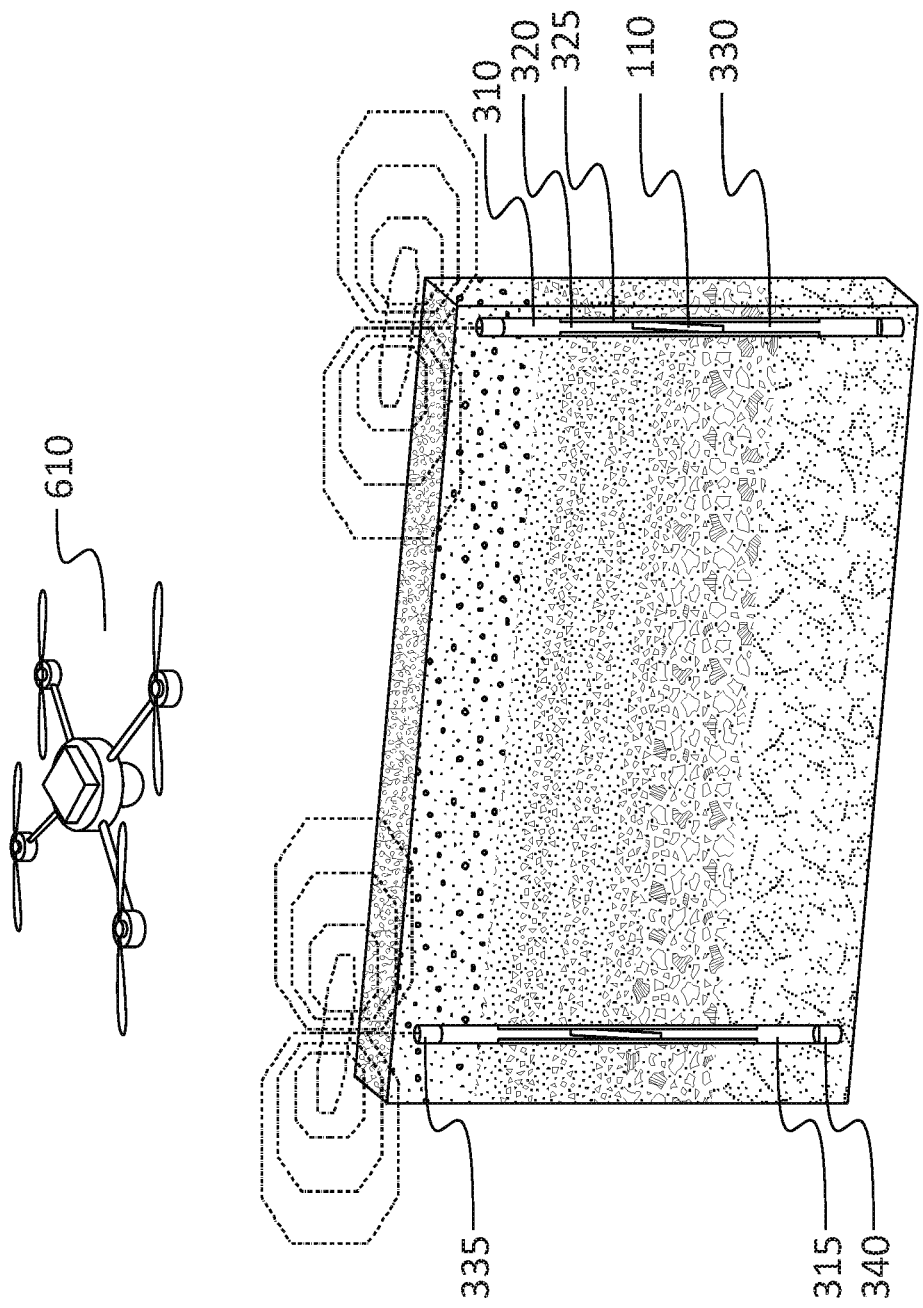
FIG. 6 is an illustration of a system including a plurality of thermoelectric generator sensor rods and an unmanned aerial vehicle for data collection, according to an embodiment of the present invention.

Referring to FIG. 6, in other embodiments an unmanned aerial vehicle (UAV) 610 executes regular flights over a plurality of thermoelectric generator sensor rods (e.g., on a farm) and each thermoelectric generator sensor rod transmits a data packet to a receiver carried by the unmanned aerial vehicle 610 as the unmanned aerial vehicle 610 passes overhead. In such an embodiment the distance over which the data are transmitted may be small, allowing the thermoelectric generator sensor rod to allocate a relatively small amount of electrical energy to each such transmission. The thermoelectric generator sensor rod may have a receiver (e.g., a radio frequency or microwave receiver) configured to receive a signal when the unmanned aerial vehicle 610 is nearby, and the thermoelectric generator sensor rod may transmit a data packet when it receives such a signal. In other embodiments the overflights of the unmanned aerial vehicle 610 may be performed at pre-scheduled times, and each thermoelectric generator sensor rod may transmit a data packet at a time when the unmanned aerial vehicle 610 is scheduled to be overhead.

The thermoelectric generator sensor rod may also be interrogated, in the manner of a radio-frequency identification (RFID) system, to extract from it sensor data such as current sensor readings or recently obtained sensor readings. For example, the thermoelectric generator sensor rod may include an antenna for receiving near-field radio frequency signals from a nearby unmanned aerial vehicle 610, and the received signal may provide DC power to the thermoelectric generator sensor rod, which may transmit back a modulated radio frequency signal carrying the sensor data.

In other embodiments a radar system may be used to interrogate the thermoelectric generator sensor rod. In such an embodiment the thermoelectric generator sensor rod may include a first conductor and a second conductor (such as two rods or straight wires) arranged end to end with a gap separating a second end of the first conductor and a first end of the second conductor, so that when the second end of the first conductor is connected to the first end of the second conductor, the combination forms a longer (composite) conductor. The connection between the conductors may be through a transistor (e.g., a microwave field effect transistor) or other switch. One of the characteristic lengths of the connected and unconnected conductor configurations (e.g., the composite conductor) may be resonant at the radar frequency, so that when the two conductors are connected together (e.g., when the transistor is turned on), the combination has a relatively large radar cross section. The thermoelectric generator sensor rod may then modulate the radar cross section (and the radar return signal) with the sensor data to be transmitted, by turning the connecting transistor on an off according, for example, to a binary representation of the sensor data.

The term "processing unit" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing unit, as used herein, each function is performed either by hardware configured, i.e., hard-wired, to perform that function, or by more general purpose hardware, such as a CPU, configured to execute instructions stored in a non-transitory storage medium. A processing unit may be fabricated on a single printed wiring board (PWB) or distributed over several interconnected PWBs. A processing unit may contain other processing units; for example a processing unit may include two processing units, an FPGA and a CPU, interconnected on a PWB.

Although limited embodiments of a buried sensor system have been specifically described and illustrated herein, many modifications and variations will be apparent to those skilled in the art. Accordingly, it is to be understood that a employed according to principles of this invention may be embodied other than as specifically described herein. The invention is also defined in the following claims, and equivalents thereof.

What is claimed is:
1. A system for underground sensing, comprising:
a sensor;
a first thermal contact surface for making contact with soil;
a second thermal contact surface for making contact with soil;
a thermoelectric generator having:
a first heat exchange surface;
a second heat exchange surface;
a first electrical contact; and
a second electrical contact;
a first thermally conductive member connecting the first thermal contact surface to the first heat exchange surface;
a second thermally conductive member connecting the second thermal contact surface to the second heat exchange surface; and
a processing unit, the system having the shape of a rod having a length greater than a diameter of the rod,
a part of the first heat exchange surface being neither parallel to nor perpendicular to the length direction of the system,
the thermoelectric generator being configured to provide electrical power at the first electrical contact and the second electrical contact in response to a difference between a temperature at the first heat exchange surface and the second heat exchange surface, and
the processing unit being configured to receive electrical power produced by the thermoelectric generator,
the system being installed entirely underground, with the first thermal contact surface in contact with soil at a first depth, and the second thermal contact surface in contact with soil at a second depth, the second depth differing from the first depth by at least 48 inches.
2. The system of claim 1, wherein the diameter is greater than 0.5 inches and less than 5 inches, and the length is greater than 48 inches and less than 120 inches.
3. The system of claim 1, wherein the first thermally conductive member is a metal rod.
4. The system of claim 1, wherein the first thermally conductive member is a heat pipe.
5. The system of claim 1, further comprising an insulating sleeve enclosing the first thermally conductive member, the second thermally conductive member, and the thermoelectric generator.
6. The system of claim 1, wherein the sensor is selected from the group consisting of temperature sensors, humidity sensors, acoustic sensors, seismic sensors, accelerometers, pH sensors, and chemical sensors.
7. The system of claim 6, wherein the sensor is a chemical sensor selected from the group consisting of nitrogen sensors, potassium sensors, phosphorous sensors, pesticide sensors, and herbicide sensors.
8. The system of claim 1, further comprising;
a communicator configured to be controlled by the processing unit to transmit sensor data as acoustic signals.
9. The system of claim 1, further comprising;
a communicator configured to be controlled by the processing unit to transmit data as electromagnetic signals.
10. The system of claim 9, wherein the electromagnetic signals are radio frequency signals.
11. The system of claim 10, further comprising an unmanned aerial vehicle configured to receive the radio frequency signals.
12. The system of claim 1, further comprising a communicator configured to have a radar cross section modulated according to bits of data in binary form.
13. The system of claim 12, wherein the communicator comprises:
a first elongated conductor; and
a second elongated conductor,
arranged end to end, and connected with a switching element.
14. The system of claim 13, wherein the switching element is a microwave transistor.
15. The system of claim 1, wherein the processing unit is configured to operate in either a waking mode or a sleep mode, the processing unit being configured to consume less power when operating in the sleep mode than when operating in the waking mode.
16. The system of claim 15, wherein the processing unit consumes less than 0.5 W when operating in the sleep mode.
17. The system of claim 1, further comprising a capacitor, wherein the system is configured to charge the capacitor utilizing electric power generated by the thermoelectric generator.
18. The system of claim 17, further comprising a switched mode power supply connected to the thermoelectric generator and to the capacitor and configured to charge the capacitor utilizing electric power generated by the thermoelectric generator.
19. The system of claim 1, wherein the thermoelectric generator comprises beryllium telluride or graphene.
20. A system for underground sensing, comprising:
a thermoelectric generator sensor rod; and
an insertion pole mechanically and electrically connected to an upper end of the thermoelectric generator sensor rod,
the thermoelectric generator sensor rod comprising:
a sensor;
a first thermal contact surface for making contact with soil;
a second thermal contact surface for making contact with soil;
a thermoelectric generator having:
a first heat exchange surface;
a second heat exchange surface;
a first electrical contact; and
a second electrical contact;
a first thermally conductive member connecting the first thermal contact surface to the first heat exchange surface;
a second thermally conductive member connecting the second thermal contact surface to the second heat exchange surface; and
a processing unit,
the thermoelectric generator being configured to provide electrical power at the first electrical contact and the second electrical contact in response to a difference between a temperature at the first heat exchange surface and the second heat exchange surface, and
the processing unit being configured to receive electrical power produced by the thermoelectric generator,
the insertion pole comprising keys and a display and being configured to allow an operator to interact with the thermoelectric generator sensor rod, while the thermoelectric generator sensor rod is underground, to verify that the sensor is generating plausible data the thermoelectric generator sensor rod having a length greater than a diameter of the rod,
a part of the first heat exchange surface being neither parallel to nor perpendicular to the length direction of the thermoelectric generator sensor rod.

* * * * *